Feb. 14, 1961 J. L. LOWRANCE 2,972,090

BI-STABLE ELECTRIC SWITCHING SYSTEM

Filed July 11, 1958

INVENTOR.
JOHN L. LOWRANCE.
BY
Robert C. Smith
ATTORNEY.

United States Patent Office 2,972,090
Patented Feb. 14, 1961

2,972,090

BI-STABLE ELECTRIC SWITCHING SYSTEM

John L. Lowrance, South Bend, Ind., assignor to The Bendix Corporation, a corporation of Delaware Filed July 11, 1958, Ser. No. 748,042

11 Claims. (Cl. 317—148.5)

The present invention relates to an electrical switching system and more particularly to a system responsive to an electrical signal representing instantaneous values of a variable quantity which is compared with a reference signal to produce an error signal wherein the system has an on-off characteristic such that for a positive error signal the system will have a saturated output and for a negative error signal, the output is zero.

In certain modern control systems it has been found desirable to provide some means for producing an off-on, latching type of operation similar to that produced by a polarized relay or a thermal switch, but in which the sensitivity and speed of response is much greater. Also, many applications are such that the vibration to which the system is exposed is sufficiently severe that mechanical switches or contacts are caused to chatter and are thereby rendered inoperative. In the case of temperature systems, the temperature response times of bi-metallic elements is often too great to be used in particular applications. Consequently, it has been found desirable to utilize electrical switching means which do not have the above disadvantages. Such an electrical system must, however, be very resistant to damage from vibration and have a high degree of temperature stability. It must also be electrically reliable and have a limited amount of hysteresis. It is therefore an object of the present invention to provide an electrical switching system of the type described in which a degree of sensitivity is provided appreciably greater than that of comparable mechanical devices.

It is another object to provide an electrical switching system in which certain of the actual switching operations are accomplished without the use of movable mechanical contacts or terminals.

It is another object to provide an electrical switching system in which the components are such that a high degree of mechanical reliability and resistance to vibration is maintained.

It is another object to provide an electrical switching system in which the components have a high degree of temperature stability.

It is a further object to provide an electrical switching system for use with a temperature sensing system in which the components exposed to temperature changes have a minimum temperature response time.

It is a further object of the present invention to provide an electrical switching system in which the amount of hysteresis is kept below a desired low value.

It is a further object of the present invention to provide a switching system utilizing an amplitude sensitive direct current amplifier with positive feedback such that the amplifier, once receiving an input pulse of proper polarity and sufficient amplitude, becomes saturated and continues to remain in this state until a pulse of the opposite polarity is received which is sufficiently large to turn the amplifier off.

It is a further object to provide a switching system utilizing an amplifier incorporating the features of the above objects and which is sensitive to the amplitude of the individual voltage input pulses rather than the average voltage level supplied.

It is a further object to provide a switching system having the above named advantages and which may be incorporated into a very small and light package.

Other objects and advantages will become apparent from the following specification taken in connection with the accompanying drawings in which.

Figures 1, 2:
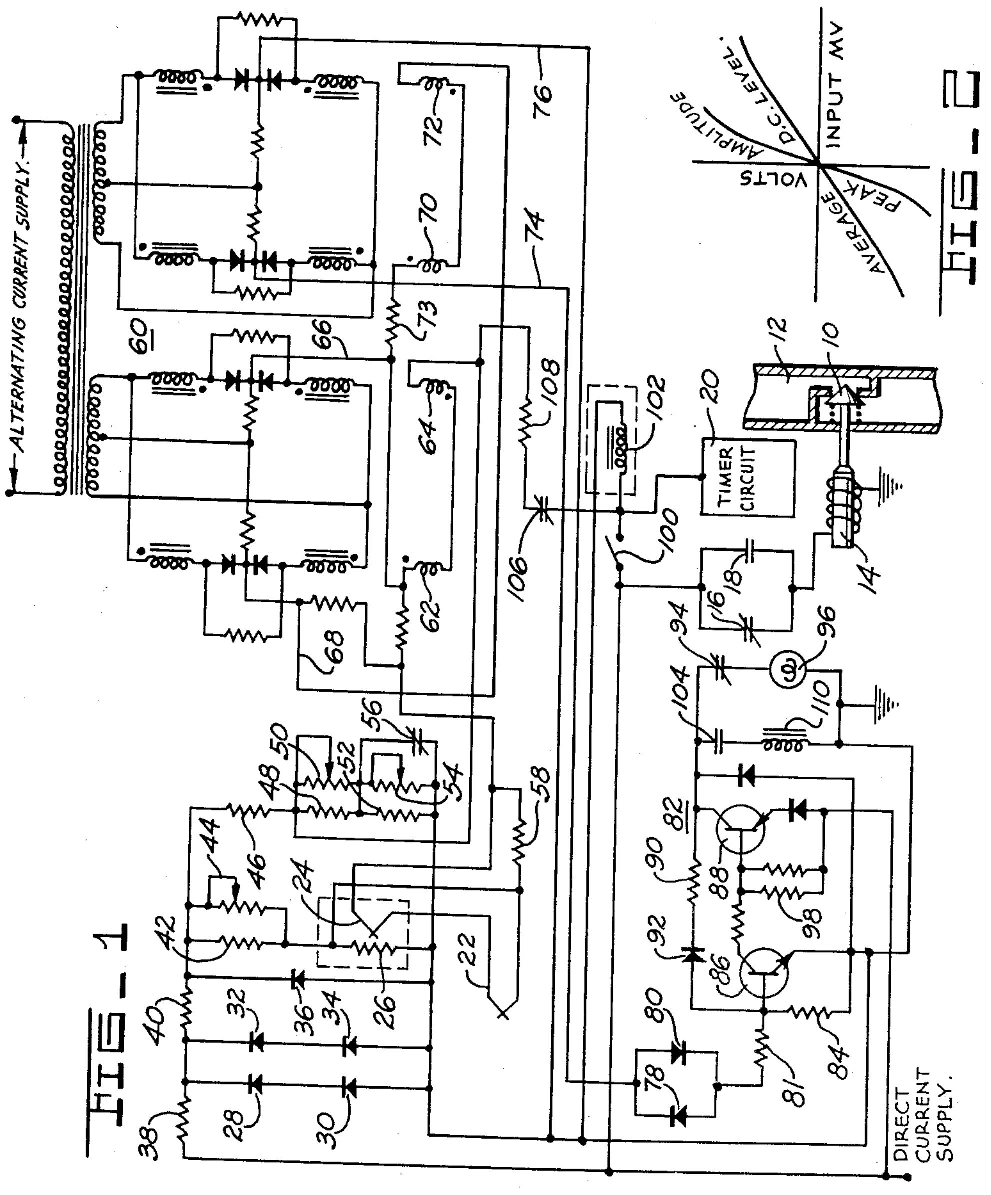
Figure 1 is a schematic drawing of a system employing my invention in connection with a temperature responsive device used to control a relay and solenoid operated valve.
Figure 2 is a graph showing the manner in which amplitude of the voltage pulsations emitted from the magnetic amplifier vary with input voltage.

Referring to Figure 1, a valve is shown at numeral 10 which will be understood as being normally biased in a closing direction. This valve controls the flow of fuel through a conduit 12 to an engine (not shown). The valve is opened upon the energizing of a solenoid 14 connected to a control voltage D.C. source through a pair of relay contact sets 16 and 18. Relay contacts 18 connected in parallel with relay contacts 16, are operated by means of a timer circuit 20. The details of the timer circuit form no part of the present invention, it being any of a number of devices well known in the art capable of supplying a current sufficient to close the relay contacts 18 after a given elapsed period of time from its energization.

The general function of the circuit shown in Figure 1 is to control the operation of valve 10 through the relay contacts 16 in response to changes in combustion temperature in the associated engine or power plant. This temperature is sensed by means of a thermocouple having a hot junction 22 and a cold junction 24. The thermocouple cold junction compensation voltage is developed across a resistor 26 having a positive temperature coefficient thereby providing cold junction compensation, in a manner well known to those skilled in the art. The thermocouple and temperature reference system is supplied from the direct current source through a two-stage, direct current regulator containing a plurality of Zener diodes 28, 30, 32, 34 and 36. Diodes 28, 30, 32 and 34 make up the primary or buffer stage of regulation. The diode 36 is the second stage of regulation. A pair of resistors 38 and 40 are chosen to limit current to the value at which the change in dynamic impedance of the diode, caused by ambient temperature changes, balances the change in Zener voltage caused by these same temperature changes. The voltage drop across the resistor 26 is controlled by means of a series connected resistor 42 and a variable resistor 44 connected in parallel therewith. Connected to the same regulated D.C. source and therefore responsive to any voltage fluctuations appearing therein is a temperature reference circuit consisting of a dropping resistor 46, a low temperature reference resistor 48 with its associated, parallel connected trim rheostat 50 and an additional reference resistor which may be considered a high temperature reference resistor 52 with its associated trim rheostat 54. Resistors 52 and 54 are connected in parallel with normally closed relay contacts 56. The output from the thermocouple circuit will have a polarity and magnitude depending upon whether the temperature sensed by the thermocouple is greater or less than that simulated by the associated reference circuit and also the degree of the departure from the reference temperature. A resistor 58 is connected in parallel with the thermocouple to ensure against erratic control operation in case the thermocouple were to open. The value of this resistor is chosen such that when the thermocouple opens there will be no output from the control.

The direct current temperature error voltage output of the temperature system just described is supplied as an input to a two-stage, push-pull, full-wave magnetic amplifier generally shown at numeral 60. The basic magnetic amplifier shown is entirely conventional in design and has been described in detail in the Patent No. 2,841,336 issued in the name of Lyle Martin (common assignee). In the absence of a signal on the control windings, each stage of the amplifier acts to produce a voltage null at the output thereof. The signal appearing on the control windings tends to unsaturate one core and drive the other core further into saturation thereby unbalancing the output of the power windings and resulting in voltage output. In the case of the amplifier shown at numeral 60, the output signal takes the form of voltage pulsations and amplitude varying with the amplitude of the input signal (temperature error signal) and a polarity varying with the polarity of said input signal. The frequency of the pulsations is controlled by the frequency of the alternating current power supply. When the temperature circuit produces an output signal this signal is impressed upon the control windings 62 and 64 of the first stage of the magnetic amplifier 60. The output of this amplifier will then appear as voltage pulsations measured between wires 66 and 68, which is then impressed upon control windings 70 and 72 of the second stage of amplifier 60 in series with resistor 73. This resistor becomes necessary because the control circuit impedance of the second magnetic amplifier stage varies widely as it passes in and out of saturation. Resistor 73 ensures that the first stage will always work into a predetermined minimum output impedance. The output of this stage appearing on conductors 74 and 76 is applied to a pair of parallel connected coupling diodes 78 and 80 in series with the input of a transistor powered bi-stable amplifier 82 including input resistors 81 and 84. Resistor 81 acts as a load for the output of the second stage of the magnetic amplifier which would otherwise be nearly shorted during positive output voltage half-cycles because the diode junction (base-emitter) of transistor 86 shunts input resistor 84 at this time. Resistor 81 also limits the amount of direct current fed back from the bi-stable circuit to the second stage of the magnetic amplifier. The input signal is amplified through two stages of amplification including a first transistor 86 and a second transistor 88 connected in a common emitter configuration. The collector circuit or transistor 88 is connected to the input of the bi-stable amplifier through a resistor 90 and a Zener diode 92 in such a manner as to provide a nonlinear positive feedback for the amplifier. As soon as a voltage pulsation is supplied across input resistor 84 of sufficient amplitude that the output of transistor 88 is sufficiently large to exceed the Zener or breakdown voltage of diode 92, a substantial current flow is fed back to the input of transistor 86 thereby assuring that the amplifier will remain turned on until a negative pulsation is received from the magnetic amplifier of sufficient magnitude to cause the output of the amplifier to decrease such that the Zener diode 92 again blocks current flow from the output of the bi-stable amplifier. The output of the amplifier is applied through the normally closed contacts 94 and a lamp 96 to ground. Resistor 98 connected in the input circuit of transistor 88 is a resistive element with negative temperature coefficient and its purpose in the circuit is to stabilize the gain of transistor 88 which has a positive temperature coefficient.

When the lamp 96 is lighted, it indicates that a certain minimum warm-up temperature has been attained and that the system is ready to be operated at a higher temperature level. When the operator or pilot decides that a higher output is desired he actuates the switch 100 which energizes a relay coil 102. Energizing of this relay coil causes a contact 56 to be opened thereby placing a higher temperature reference in the circuit; causes contacts 94 to be opened thereby turning out lamp 96; closes a pair of contacts 104 connected in parallel with contacts 94 and opens a pair of contacts 106 connected to the magnetic amplifier signal windings 62 and 64. Placing contacts 106 in the circuit with the switch 100 and the relay coil 102 causes a negative voltage pulse to be supplied to the signal windings 62 and 64 of the magnetic amplifier which tends to overcome the positive saturation on the amplifier normally existing at the time the switch is actuated. This positive saturation or bias of the amplifier tends to cause an excessive delay in the response of the magnetic amplifier to comparatively low level negative signals emanating from the temperature circuit. By placing contacts 106 in the circuit with the control windings, this negative voltage pulse, having a duration dependent upon the electro-mechanical lag of the contacts, is effective to overcome this positive bias. A resistor 108 connected in the line with contacts 106 controls the effective amplitude of this negative voltage pulse. Closing of the switch 100 also causes a signal to be supplied to the timer circuit 20 resulting in closing of the normally open contacts 18 and resulting in energizing of the solenoid 14 causing valve 10 to be moved in an opening direction. The temperature reference is now at a much higher value and the system receives a negative or undertemperature signal from the temperature circuit. This results in negative pulsations being supplied from the magnetic amplifier to the bi-stable amplifier 82 of such size to overcome the positive feedback across resistor 84 thereby shutting off the bi-stable amplifier. Within the period established by the timer circuit 20 the opening of valve 10 should result in increasing of the temperature in the associated engine or power plant to the reference value set in the temperature reference circuit. When this value is reached, the polarity of the error voltage changes and positive pulses begin to emanate from the magnetic amplifier 60. At some point these pulsations reach an amplitude sufficient to again actuate the bi-stable amplifier 82 whereupon its output is now caused to flow through relay contacts 104, and a relay 110 to ground. Energizing the relay 110 causes the contacts 16 to be closed thus maintaining solenoid 14 in an energized condition even though the timer circuit 20 subsequently opens contacts 18. Failure of the engine or associated prime mover to reach the reference higher temperature value within the allotted time period is an indication of malfunction, and when this occurs it is desired that the system be shut down immediately. This is accomplished by the timer circuit 20 which would then open contacts 18 before contacts 16 were closed. The resulting deenergization of solenoid 14 causes valve 10 to be closed and the temperature of the associated engine is therefore reduced.

Figure 2 shows the manner in which the magnetic amplifier output varies with the input signal applied thereto. This graph shows a curve of average D.C. voltage level versus input millivoltage and a curve of voltage amplitude of the pulsations emanating from the amplifier plotted against the input millivoltage received from the temperature circuit. As will be observed from these curves, the amplitude of the voltage pulsations increases much more rapidly than does the average D.C. level with small changes in input signal of either polarity. This is rather basic to the operation of the system inasmuch as the bi-stable amplifier 82 is responsive to the height of the voltage pulses supplied to it rather than to the average D.C. voltage level.

It will be apparent to those skilled in this art that the system thus far described has an inherent dead-band or hysteresis characteristic. With very low level signals of either polarity emanating from the temperature system, the voltage pulses received by the bi-stable amplifier from the magnetic amplifier may not, even after being amplified, be of sufficient magnitude to exceed the Zener voltage of the diode 92. Assume, for the moment, a positive voltage pulsation just sufficient to operate the bi-stable amplifier 82. This immediately causes the system to be saturated in the positive direction. In order to shut off the bi-stable amplifier, a negative pulse supplied thereto must be large enough to overcome the positive saturation of the amplifier and to return the Zener diode 92 to its normally non-conducting state. This means that the negative pulsation required to turn the amplifier off must necessarily be somewhat greater in amplitude than the positive pulse initially required to turn the amplifier on.

During the time when the bi-stable amplifier 82 is conducting and current is flowing in the feedback path to diode 92 this feedback voltage tends to cause current flow back to the second stage of the magnetic amplifier. In practice this has been found to equal approximately 1 volt. Because of the inherent voltage drop across the diode 78 even when conducting in its forward direction, approximately 0.7 volt is attenuated by this diode and the resulting amount of feedback to the magnetic amplifier, which results in a signal subtracting magnetically from the positive input to the second stage, may be successfully utilized to decrease the dead-band of the system to a desired value.

In discussing the operation of the disclosed system it will first be assumed that the associated engine or prime mover is operating at some temperature below the lower of the two temperatures which may be requested in the temperature reference network. Under these conditions the output of the temperature circuit will be negative and the output of the magnetic amplifier will consist of negative pulsations having a magnitude varying with the extent of departure from the reference and which have no effect on the bi-stable amplifier 82 other than to insure that it remains in its turned-off phase of operation. When the hot junction 22 of the thermocouple senses the temperature in excess of the reference temperature the temperature circuit then produces a low level direct current signal of positive polarity which when applied to the signal windings of magnetic amplifier 60 results in an output from that amplifier of positive pulses having a magnitude varying with the extent to which the temperature sensed by the thermocouple exceeds the reference value. At some point these pulses become great enough in amplitude when amplified by the transistor amplifier to overcome the Zener voltage of diode 92 and the amplifier 82 is then turned on and turns on the lamp 96. The pilot or operator then knows that the system is operating at a temperature level where it is possible to request a full power output. At any time desired the operator may close switch 100 thereby actuating the relay coil 102 thus opening contact 56 and requesting a higher temperature reference, closing contacts 104, and opening contacts 94 thereby turning off the lamp 96. Contacts 106 are also opened but because of the inherent lag in response to these contacts a negative voltage pulse is supplied to the magnetic amplifiers for overcoming the positive saturation of the magnetic amplifier. Closing of switch 100 also causes the timer circuit 20 to close the contact 18 thereby providing a current flow through the solenoid 14 to move the valve 10 in an opening direction. The circuit is now operating under a condition where the temperature sensed by the thermocouple 22 is very substantially below that requested. A negative signal will therefore be supplied from the temperature circuit, negative pulses will be supplied from the magnetic amplifier and the bi-stable amplifier 82 will be held in a turned-off condition. Because the valve 10 is held in an open position by the current flow through the contacts 18 and the solenoid 14, the associated engine or prime mover will heat up very rapidly and this increase in temperature will be sensed by the thermocouple hot junction 22. As soon as this thermocouple senses the temperature in excess of that requested on the temperature reference, a positive output signal is again supplied to the magnetic amplifier, which produces positive pulsations in response thereto, and these positive pulsations, as amplified, very quickly reach a value sufficient to overcome the Zener voltage of diode 92 thereby saturating the amplifier in its turned-on condition of operation. The output of the amplifier then flows through the contacts 104 which have been closed by actuation of the switch 100 and through the relay winding 110 to ground. Energizing the winding 110 causes the contacts 16 to be closed thereby assuring current flow through the solenoid 14 and maintenance of the valve 10 in its open position irrespective of the subsequent opening of the contacts 18 and by the timer circuit 20.

Although only one embodiment is shown and described herein, modifications may be made to suit individual requirements. While the system has been described in terms of certain polarity relationships, obviously these may be reversed, if desired.

I claim:

1. A bi-stable electrical switching system for use with a condition sensing system comprising a direct current voltage source, means producing a direct current voltage varying with the magnitude of a variable quantity, means producing first and second direct current reference voltages, means comparing one of said first or second reference voltages with said varying direct current voltage to produce an error voltage, a push-pull, full wave magnetic amplifier for amplifying said error voltage and converting said voltage into pulsations, the amplitude of which are variable with the magnitude of said error voltage, a saturable bi-stable amplifier for receiving said pulsations including a Zener diode and a plurality of stages and having positive feedback, a relay connected to be operated by the output of said amplifier, means controlled by said relay for varying the values of said variable condition, relay means for switching said one reference voltage out of the circuit and switching said other reference voltage into the circuit, means including said relay means connecting said direct current voltage source to said magnetic amplifier such that upon energization of said relay means a large negative voltage pulse is supplied to the control windings of said magnetic amplifier to cause said magnetic amplifier to produce an output signal capable of causing current flow through said Zener diode to be cut off thereby turning said bi-stable amplifier off.

2. A switching system for a temperature control device including an electrically driven valve, comprising means producing a direct current voltage varying with instantaneous values of a temperature sensed, means producing a direct current voltage representative of a desired temperature value, relay means for changing the value of said reference voltage, means comparing said temperature voltage with said reference voltage to produce a temperature error voltage of a polarity and magnitude dependent upon the direction and departure of said temperature voltage from said reference voltage, magnetic amplifier means for receiving said temperature error voltage and producing a pulsating direct current output voltage varying in polarity with the polarity of said error voltage and in the amplitude of the voltage pulses with the magnitude of said error signal, a saturable bi-stable amplifier for receiving said pulsations including a non-linear positive feedback loop containing a Zener diode, a relay connected to be operated by the output of said bi-stable amplifier and connected to actuate said valve.

3. A switching system for a temperature control device including an electrically driven valve comprising a direct current voltage source, means producing a direct current voltage varying with instantaneous values of a temperature sensed, means connected to said source producing a direct current voltage representative of a desired temperature value, relay means for changing the value of said reference voltage, means comparing said temperature voltage with said reference voltage to produce a temperature error voltage of a polarity and magnitude dependent upon the direction and departure of said temperature voltage from said reference voltage, magnetic amplifier means for receiving said temperature error voltage and producing a pulsating direct current output varying in polarity with the polarity of said error voltage and in the amplitude of the voltage pulses with the magnitude of said error signal, a saturable bi-stable amplifier for receiving said pulsations containing a Zener diode across which said voltage pulses are impressed, said diode being responsive to a voltage pulsation of a given amplitude to produce a positive feedback signal causing said bi-stable amplifier to become saturated and, when saturated, being responsive to a voltage pulsation of the opposite polarity and of a magnitude sufficient to cause interruption of current flow across said Zener diode, to turn said bi-stable amplifier off, and a relay connected to be operated by said bi-stable amplifier and connected to actuate said electrically driven valve.

4. A switching system as set forth in claim 3 wherein said relay means are connected between said magnetic amplifier and said direct current voltage source such that upon energizing of said relay means a large voltage pulse is supplied to said magnetic amplifier of such polarity as to cause said magnetic amplifier to produce an output signal of sufficient magnitude to overcome the feedback around said bi-stable amplifier thereby turning said bi-stable amplifier off.

5. A switching system as set forth in claim 3 wherein an additional timer-operated relay is connected in parallel with said relay such that said relay must be closed within a given time period following operation of said relay means or said timer-operated relay will interrupt the flow of current to said electrically driven valve.

6. A bi-stable electric switching system comprising means producing a control signal varying in polarity and magnitude with the direction and extent of departure of a sensed condition from a reference value, magnetic amplifier means for receiving said control signal and producing a pulsating direct current output varying in polarity with the polarity of said control signal and in the amplitude of the voltage pulses with the magnitude of said control signal, a saturable bi-stable amplifier for receiving said pulsations containing a Zener diode across which said voltage pulses are impressed, said diode being responsive to a voltage pulsation of a given amplitude to produce a positive feedback signal causing said bi-stable amplifier to become saturated and, when saturated, being responsive to a voltage pulsation of the opposite polarity and of a magnitude sufficient to cause interruption of current flow across said Zener diode, to turn said bi-stable amplifier off, and a relay connected to be operated by the output of said bi-stable amplifier.

7. A bi-stable electric switching system as set forth in claim 6 including a direct current voltage source and relay means connected between said magnetic amplifier and said source such that upon energizing of said relay means, a large voltage pulse of said opposite polarity is supplied to said magnetic amplifier whereby said magnetic amplifier is caused to produce an output signal of sufficient magnitude to overcome the feedback around said bi-stable amplifier, thereby turning said bi-stable amplifier off.

8. A bi-stable electric switching system comprising means producing a control signal varying in polarity and magnitude with the direction and extent of departure of a sensed condition from a reference value, magnetic amplifier means for receiving said control signal and producing a pulsating direct current output varying in polarity with the polarity of said control signal and in the amplitude of the voltage pulses with the magnitude of said control signal, a saturable bi-stable amplifier for receiving said pulsations including a positive feedback loop containing a Zener diode, coupling means connected between said bi-stable amplifier and said magnetic amplifier comprising a pair of diodes connected in parallel with each other and conductive in opposite directions, and a relay connected to be operated by the output of said bi-stable amplifier.

9. A bi-stable electric switching system comprising means producing a control signal varying in polarity and magnitude with the direction and extent of departure of a sensed condition from a reference value, magnetic amplifier means for receiving said control signal and producing a pulsating direct current output varying in polarity with the polarity of said control signal and in the amplitude of the voltage pulses with the magnitude of said control signal, a saturable bi-stable amplifier for receiving said pulsations including a positive feedback loop containing a Zener diode, and a relay connected to be operated by the output of said bi-stable amplifier.

10. A bi-stable electric switching system comprising means producing a direct current voltage varying with the magnitude of a variable quantity, means producing a direct current reference voltage, means comparing said direct current voltage with said reference voltage to produce an error voltage, a push-pull, full wave magnetic amplifier for amplifying said error voltage and converting said voltage into pulsations, the amplitude of which is variable with the magnitude of said error voltage, a saturable bi-stable amplifier for receiving said pulsations including a plurality of stages and having non-linear positive feedback, and a relay connected to be operated by the output of said amplifier.

11. A bi-stable electric switching system as set forth in claim 10 wherein said bi-stable amplifier includes a Zener diode and relay means are provided connected to said magnetic amplifier such that upon energization of said relay means a large voltage pulse is supplied to said magnetic amplifier of such polarity as to cause said magnetic amplifier to produce an output signal of sufficient magnitude to overcome the feedback around said bi-stable amplifier thereby turning said bi-stable amplifier off.

References Cited in the file of this patent

UNITED STATES PATENTS

| | | |
|---|---|---|
| 2,706,765 | Lengvenis | Apr. 19, 1955 |
| 2,759,124 | Willis | Aug. 14, 1956 |